(12) United States Patent
Mann et al.

(10) Patent No.: US 7,629,292 B2
(45) Date of Patent: *Dec. 8, 2009

(54) COMPOSITE MEDIA FOR ION PROCESSING

(75) Inventors: Nick R. Mann, Blackfoot, ID (US);
Donald J. Wood, Peshastin, WA (US);
Terry A. Todd, Aberdeen, ID (US);
Ferdinand Sebesta, Prague (CZ)

(73) Assignee: Battelle Energy Alliance, LLC, Idaho Falls, ID (US)

( * ) Notice: Subject to any disclaimer, the term of this patent is extended or adjusted under 35 U.S.C. 154(b) by 634 days.

This patent is subject to a terminal disclaimer.

(21) Appl. No.: 11/154,976

(22) Filed: Jun. 15, 2005

(65) Prior Publication Data

US 2006/0041043 A1   Feb. 23, 2006

Related U.S. Application Data

(60) Continuation-in-part of application No. 10/302,471, filed on Nov. 21, 2002, now Pat. No. 7,507,340, which is a continuation-in-part of application No. 10/021,663, filed on Oct. 23, 2001, now abandoned, which is a division of application No. 10/039,320, filed on Oct. 19, 2001, now Pat. No. 6,514,566.

(60) Provisional application No. 60/242,623, filed on Oct. 23, 2000, provisional application No. 60/241,736, filed on Oct. 19, 2000.

(51) Int. Cl.
*B01J 20/26* (2006.01)
*C08K 5/5399* (2006.01)
*B01D 39/00* (2006.01)
*B01D 24/00* (2006.01)

(52) U.S. Cl. ............ 502/402; 524/116; 210/505

(58) Field of Classification Search ............ 502/401, 502/400, 402; 201/502.1, 505; 524/116
See application file for complete search history.

(56) References Cited

U.S. PATENT DOCUMENTS

| 3,019,127 A | 1/1962 | Czerwonka et al. |
| 3,622,268 A | 11/1971 | Wada et al. |
| 3,644,251 A | 2/1972 | Wilhelmi |
| 3,960,762 A | 6/1976 | Kroebel et al. |

(Continued)

FOREIGN PATENT DOCUMENTS

CS   273 369   12/1990

OTHER PUBLICATIONS

Barney, G.S., "Test Plan for Demonstrating Plutonium Extraction from 10-L Solutions Using EIChrom Extraction Chromatographic Resins," USDOE, Aug. 15, 1994.*

(Continued)

*Primary Examiner*—Steven Bos
*Assistant Examiner*—Anthony J Zimmer
(74) *Attorney, Agent, or Firm*—TraskBritt

(57) ABSTRACT

Composite media, systems, and devices for substantially removing, or otherwise processing, one or more constituents of a fluid stream. The composite media comprise a plurality of beads, each having a matrix substantially comprising polyacrylonitrile (PAN) and supporting one or more active components which are effective in removing, by various mechanisms, one or more constituents from a fluid stream. Due to the porosity and large surface area of the beads, a high level of contact is achieved between composite media of the present invention and the fluid stream being processed. Further, the homogeneity of the beads facilitates use of the beads in high volume applications where it is desired to effectively process a large volume of flow per unit of time.

11 Claims, 7 Drawing Sheets

U.S. PATENT DOCUMENTS

| | | | |
|---|---|---|---|
| 4,239,516 | A | 12/1980 | Klein |
| 4,443,339 | A | 4/1984 | Rosevear |
| 4,548,790 | A | 10/1985 | Horwitz et al. |
| 4,683,124 | A | 7/1987 | Muscatello et al. |
| 4,826,604 | A | 5/1989 | Faubel et al. |
| 4,835,107 | A | 5/1989 | Horwitz et al. |
| 5,169,609 | A | 12/1992 | Horwitz et al. |
| 5,268,097 | A | 12/1993 | Girot et al. |
| 5,279,745 | A * | 1/1994 | Jeffers et al. ............... 210/688 |
| 5,445,732 | A | 8/1995 | Girot et al. |
| 5,454,946 | A | 10/1995 | Heagle et al. |
| 5,486,292 | A | 1/1996 | Bair et al. |
| 5,518,707 | A | 5/1996 | Bedard et al. |
| 5,637,506 | A | 6/1997 | Goken et al. |
| 5,667,695 | A | 9/1997 | Bedard et al. |
| 5,788,826 | A | 8/1998 | Nyberg |
| 5,891,559 | A | 4/1999 | Goken et al. |
| 5,906,734 | A | 5/1999 | Girot et al. |
| 5,989,434 | A | 11/1999 | Lundquist et al. |
| 6,034,149 | A | 3/2000 | Bleys et al. |
| 6,103,122 | A | 8/2000 | Hou et al. |
| 6,312,598 | B1 | 11/2001 | Munson et al. |
| 6,395,830 | B1 | 5/2002 | Jonas et al. |
| 6,436,294 | B2 | 8/2002 | Lundquist |
| 6,514,566 | B2 | 2/2003 | Mann et al. |
| 2002/0121470 | A1 | 9/2002 | Mann et al. |

OTHER PUBLICATIONS

Braun, R., et al, "Ion Exchange Performance of Commercial Crystalline Silicontitanates for Cesium Removal," Waste Management '96, Tucson Arizona, pp. 1-20.

Brewer et al, Czech. J. Phus., 49, pp. 959-964, 1999.

John et al, NATO Sci. Ser., Ser. 2, 53, pp. 155-168, 1999.

Lumetta et al, Solvent Extr, Ion Exch., 14(1), pp. 35-60, 1996.

Material Safety Data Sheet UOPtm IONSIVtm Ion Exchanger Type IE-911, Jul. 1996 pp. 1-4.

Material Safety Data Sheet UOPtm IONSIVtm IE-910 Ion Exchange Powder, Dec. 1994 pp. 1-4.

Miller et al, Sep. Sci. Technol., 32(1-4), pp. 37-50, 1997.

Miller, J.E., et al, "Development and Properties of Crystalline Silicotitanate (CST) Ion Exchangers for Radioactive Waste Applications," Sandia Report, Sandia National Laboratories, SAND97-0071, Apr. 1997, pp. 1-57.

Muscatello et al, ACS Symp. Ser., 347, pp. 182-189, 1987.

Muscatello et al, Chem. Set., vol. 2, pp. 439-448, 1986.

Schulte et al, Proc. Embedded Top Meet. DOE Spent Nucl. Fuel Fissile Mater. Manage., pp. 418-427, 1996.

Schulte et al, Sep. Sci. Technol., 30(7-9), pp. 1833-1847, 1995.

Sebesta et al, Acta Polytech., 38(3), pp. 119-120, 1998.

Sebesta et al, J. Radiooanal, Nucl. Chem. 140(1), pp. 15-21, 1990.

Sebesta et al, R. Soc. Chem., 182, pp. 346-354, 1996.

Sebesta, F., et al., "Application of AMP-PAN/SF02 Absorber for 137Cs Separation from INEEL Dissolved Calcine Solutions," Czech Technical University in Prague, Sep. 1997 pp. 1-14.

Sebesta, F., "Composite Sorbents of Inorganic Ion-Exchangers and Polyacrylonitrile Binding Matrix," Journal of Radioanalytical and Nuclear Chemistry, vol. 220, No. 1 (1997) pp. 77-88.

Sebesta, F., et al, "Waste Treatment and Immobilization Technologies Involving Inorganic Sorbents," International Atomic Energy Agency, Jun. 1997, pp. 79-103.

* cited by examiner

COMPOSITE MEDIA FOR ION PROCESSING

CROSS-REFERENCE TO RELATED APPLICATIONS

This application is a continuation-in-part of U.S. patent application Ser. No. 10/021,663, now abandoned, filed Oct. 23, 2001, which claims priority to U.S. patent application 60/242,623, filed Oct. 23, 2000, each of which is hereby incorporated by reference. This application is also a continuation-in-part of U.S. patent application Ser. No. 10/302,471, filed Nov. 21, 2002 now U.S. Pat. No. 7,507,340, which is a divisional of U.S. patent application Ser. No. 10/039,320, filed on Oct. 19, 2001, now U.S. Pat. No. 6,514,566, issued Feb. 4, 2003, which claims priority to U.S. patent application Ser. No. 60/241,736, filed Oct. 19, 2000, each of which is hereby incorporated by reference.

CONTRACTUAL ORIGIN OF THE INVENTION

This invention was made with government support under Contract No. DE-AC07-99ID13727 and Contract No. DE-AC07-05ID14517 awarded by the United States Department of Energy. The government has certain rights in this invention.

FIELD OF THE INVENTION

The present invention relates generally to the preparation and use of composite media for use in ion processing. More particularly, embodiments of the present invention relate to the preparation and use of composite media that include active components supported by large surface area matrix materials and are suitable for facilitating removal of various ions from fluid streams.

BACKGROUND OF THE INVENTION

Effective and efficient ion processing is an important consideration in numerous chemical and industrial processes. In general, ion processing refers to those processes, and/or devices which implement such processes that are used to facilitate neutralization, removal, concentration, or other processing, of one or more ions present in a fluid stream, examples of which include industrial waste and process streams. One example of such a process concerns the removal of materials such as cesium, strontium, and/or uranium from an industrial waste stream prior to the discharge of the fluid stream into the environment.

While ion processing components and processes are often employed to remove undesirable constituents of a fluid volume or stream, such components and processes may also be used to collect and concentrate one or more desirable constituents of a fluid volume or stream so that those constituents can then be reserved for future use.

One area where ion processing techniques, materials, and devices are particularly useful is in the industrial environment. Typical industrial waste and process streams present at least two significant challenges to ion processing efforts. The first challenge relates to the flow rates of such industrial waste and process streams. Because industrial waste and process streams are often characterized by relatively high flow rates, the associated ion processing materials, systems, and components must be capable of admitting and processing the high flow rate waste and process streams without introducing an undue pressure drop or other resistance to flow that would tend to compromise the flow rate of those streams, and thereby slow down the overall rate at which ion processing occurs.

Another challenge that must be considered when implementing the treatment of industrial waste and process streams relates to the level of cleanliness that must be attained in the processed stream. In particular, the streams produced in industrial environments are often required to meet stringent standards with regard to the permissible concentration of various contaminants or other materials that are ultimately discharged into the environment. Thus, the treatment systems and devices must not only be able to handle relatively high fluid flow rates, but they must do so at a high level of efficiency.

Generally, the effectiveness and efficiency of a particular ion processing material is at least partially a function of the total surface area of the active component that contacts the material or fluid to be processed. The surface area, in turn, is a function of the porosity, or pore volume, of the ion processing material, so that relatively more porous ion processing materials typically possess a relatively greater surface area than relatively less porous ion processing materials. Thus, when considering two ion processing materials equivalent in all other regards, an ion processing material with a relatively larger surface area is capable of removing a relatively greater amount of contaminants or impurities from a fluid stream than an ion processing material with a relatively smaller surface area. In light of this relationship, a number of ion processing materials, systems, and devices have been devised with a view towards providing a relative increase in the surface area of the ion processing material so as to improve its effectiveness.

Various methods may be used to prepare ion processing materials so as to provide a relative increase in the surface area of the active component, of the ion processing material, that comes into contact with the fluid stream to be processed. In one case, the ion processing material takes the form of a composite medium that generally includes a supporting matrix and one or more active components dispersed within the matrix. Typically, the matrix comprises a plurality of small, slightly porous particles, sometimes referred to as beads. As suggested above, the overall surface area of the ion processing material that contacts the fluid stream simply comprises the sum of the surface areas of each of the individual beads which, in turn, is a function of pore volume.

In order to form the ion processing material, the matrix material is mixed with a particular active component selected for its ability to remove one or more pre-determined constituents from the fluid stream. The ion processing material thus produced is typically disposed in a column through which the fluid stream to be processed is passed. Because the beads of the matrix material often assume a somewhat spherical shape, a plurality of spaces is cooperatively defined by adjacent beads. Accordingly, the fluid stream is able to flow through the ion processing material by working its way through the spaces between the individual beads.

While the slight porosity of some beads allows for a relatively greater ion processing area than would be possible if the beads were simply solid, such matrix materials have, as a result of their relatively small pore volume, proven rather ineffective in providing the performance required for effective and efficient processing of high volume fluid streams. Of course, the surface area of such ion processing materials can be increased somewhat by increasing the number of beads present in a particular column. However, there are practical limits to the attainment of very small bead sizes. Furthermore, while an increase in the number of beads produces a desirable overall increase in pore volume, and thus ion processing area, the increase represents a tradeoff with respect to the flow rate that a particular ion processing material can effectively accommodate.

In particular, as bead size is reduced, the size of the air spaces between adjacent beads is correspondingly reduced. Reduction in the size of the air spaces has at least one unfavorable consequence with respect to the flow of the fluid stream. Specifically, assuming a constant flow velocity, the volume of fluid that can flow through an opening is primarily a function of the size or area of that opening. This idea is generally expressed in the relationship Q=Va, where "Q" is the volume of fluid flow per unit of time, "V" is the velocity of the fluid, and "a" is the area through which the fluid passes.

In general then, where two volumes of ion processing materials in the form of respective composite media, equal in all other respects, have different numbers of beads, the volume of the ion processing material with relatively more beads defines a relatively smaller space through which the process stream can flow. In view of the aforementioned flow relationship, this means that the volume of ion processing material with a relatively greater number of beads is relatively more resistant to the flow of the process stream. Accordingly, in the case of an ion processing material comprised of very small particles, a powdered ion processing material for example, the resistance of the ion processing material to fluid flow is significant.

Thus, in the case of ion processing materials comprised of a composite medium employing a bead-type matrix, the surface area of the ion processing material can be readily increased by increasing the number of beads. However, due to the inverse relationship, discussed above, between the air volume defined by the ion processing material and the ability of a given volume of the ion processing material to pass a predetermined flow, there are practical limits to the extent to which the surface area may usefully be increased.

As suggested earlier, another common ion processing material configuration is designed along the same general principles as those ion processing materials formed as composite media, but takes on a somewhat different form. In this particular configuration, no matrix is employed. Rather, a finely granulated or powdered active component is simply compressed under high pressure to form an ion processing material comprising a plurality of granules, or pellets, which are then disposed in a column for processing of a fluid stream.

While ion processing materials using compressed active component configurations typically have relatively large surface areas, they suffer from a variety of significant shortcomings. First, because the active component is initially in a powdered form, the flow of the fluid through a bed of granules of the active component of the ion processing material tends to wash away some of the active component, thus reducing the effectiveness and efficiency of the ion processing material over time. Another problem is that granules or pellets of the compressed active component tend to be rather brittle and can be easily broken and thereby rendered ineffective. Further, ion processing materials formed in this manner tend to crumble and fall apart over a period of time. Such ion processing material configurations are not well suited to withstand the rough handling and other conditions that may occur in many industrial environments.

Yet another shortcoming of compressed active component ion processing materials concerns the compression process that is used to form the granules or pellets of the compressed active component. In particular, large compressive forces are typically employed in order to ensure that the active component granules assume and retain the desired shape and size. However, the forces used to form the active component granules compress the active component so tightly that it is often the case that the fluid flow being processed never penetrates to the active component at the inner portion of the granules. Thus, the ion processing capacity of the active component in these types of ion processing materials is not fully utilized and much of the active component is essentially wasted. Such waste unnecessarily increases the amount, and thus the cost, of the ion processing material.

While the aforementioned shortcomings are of some concern in low volume ion processing applications such as might be encountered in a laboratory, these characteristics of ion processing materials that comprise compressed active component granules render such ion processing materials particularly unsuited for high volume applications such as are typically encountered in industrial environments.

In view of the foregoing problems and shortcomings with existing ion processing materials, it would be an advancement in the art to provide a composite medium comprising one or more active components uniformly dispersed in a matrix material having a relatively high surface area, and to provide a composite medium that offers relatively little resistance to fluid flow while affording the ability to employ a wide range of active component weight percent loading conditions.

BRIEF SUMMARY OF THE INVENTION

The present invention has been developed in response to the current state of the art, and in particular, in response to these and other problems and needs that have not been fully or adequately addressed by currently available ion processing materials.

Briefly summarized, embodiments of the invention are directed to composite media suitable for use in ion processing, and comprising a large surface area matrix material within which one or more active components are disposed. Embodiments of the invention are particularly well suited for use in high volume applications requiring effective and efficient removal, or other processing, of actinides such as uranium (U), plutonium (Pu), and americium (Am), lanthanides such as europium (Eu) and cerium (Ce), alkali metals such as cesium (Cs), alkaline earth metals such as strontium (Sr), organic contaminants, and chlorine, such as from water that is to be used for human consumption. In general, however, embodiments of the invention are effective in any application where efficient and effective ion processing of high volume flows is required.

Note that, as used herein, "actinides" include any and all elements of the Actinide Series as depicted by the periodic chart of the elements, as well as any and all compounds substantially comprising an element of the Actinide Series. Similarly, "lanthanides" refer to any and all elements of the Lanthanide Series as depicted by the periodic chart of the elements, as well as any and all compounds substantially comprising an element of the Lanthanide Series.

In one embodiment of the invention, the matrix material of the composite medium comprises an organic polymer, such as polyacrylonitrile (PAN), formed as a plurality of substantially spherical and porous beads. An active component, such as crystalline silicotitanate (CST), carbon, or octyl (phenyl) N,N-diisobutylcarbamoylmethylphosphine oxide (CMPO) for example, is dispersed throughout the matrix material.

In one embodiment of the invention, the composite medium is prepared by first dissolving a desired amount of PAN in a solvent, nitric acid ($HNO_3$) for example, so as to produce a matrix solution of a desired concentration. One or more active components are then mixed with the matrix solution to produce a composite medium solution (CMS), which may comprise a suspension, emulsion, solution, or other form. Preferably, both the dissolution of the PAN and the mixing of the active component(s) with the matrix solution are performed at room temperature and pressure. The CMS thus formed is then dispensed through one end of a fluid conduit.

Substantially simultaneously with the dispensation of the CMS from the fluid conduit, a flow of gas is directed through the end of the fluid conduit so that the flow of gas cooperates with that end to draw at least a portion of the CMS out of the fluid conduit as a plurality of drops. The plurality of drops thus formed may be deposited in a bath, such as a water bath, so as to dilute the solvent in the CMS and thereby cause solidification of the drops. After dilution of the solvent is complete, the drops are then dried to form a plurality of substantially spherical and porous beads.

In operation, the beads of composite medium are disposed in a chamber, or column, that is connected in-line with a flow of fluid to be processed, such as a waste stream. Due to the relatively large pore volume defined by the matrix material, the beads collectively define a relatively large surface area and thus the active component distributed through the matrix possesses a relatively high ion processing capacity with respect to the fluid flow passing through the composite medium. Additionally, the uniform size and shape of the beads contribute to the enhancement of the kinetic properties of the composite medium. Finally, because the beads are relatively durable, they are well suited to withstand the rough handling and environmental conditions typically encountered in industrial applications.

These and other features and advantages of the present invention will become more fully apparent from the following description and appended claims.

BRIEF DESCRIPTION OF THE SEVERAL VIEWS OF THE DRAWINGS

In order to more fully understand the manner in which the above-recited and other advantages and features of the invention are obtained, a more particular description of the invention will be rendered by reference to specific embodiments thereof which are illustrated in the appended drawings. Understanding that these drawings depict only typical embodiments of the invention and are not therefore to be considered to be limiting of its scope, the invention and its presently understood best mode for making and using the same will be described and explained with additional specificity and detail through the use of the accompanying drawings in which.

DETAILED DESCRIPTION OF THE INVENTION

Reference will now be made to figures wherein like structures will be provided with like reference designations. It is to be understood that the drawings are diagrammatic and schematic representations of exemplary embodiments of the invention, and are not to be construed as limiting the scope of the invention in any way.

Briefly summarized, the present invention relates to composite media having one or more active components that use various mechanisms to process various constituents of a fluid stream. FIGS. 1 through 7 indicate various exemplary embodiments of composite media, and related devices and systems.

Figure 1:
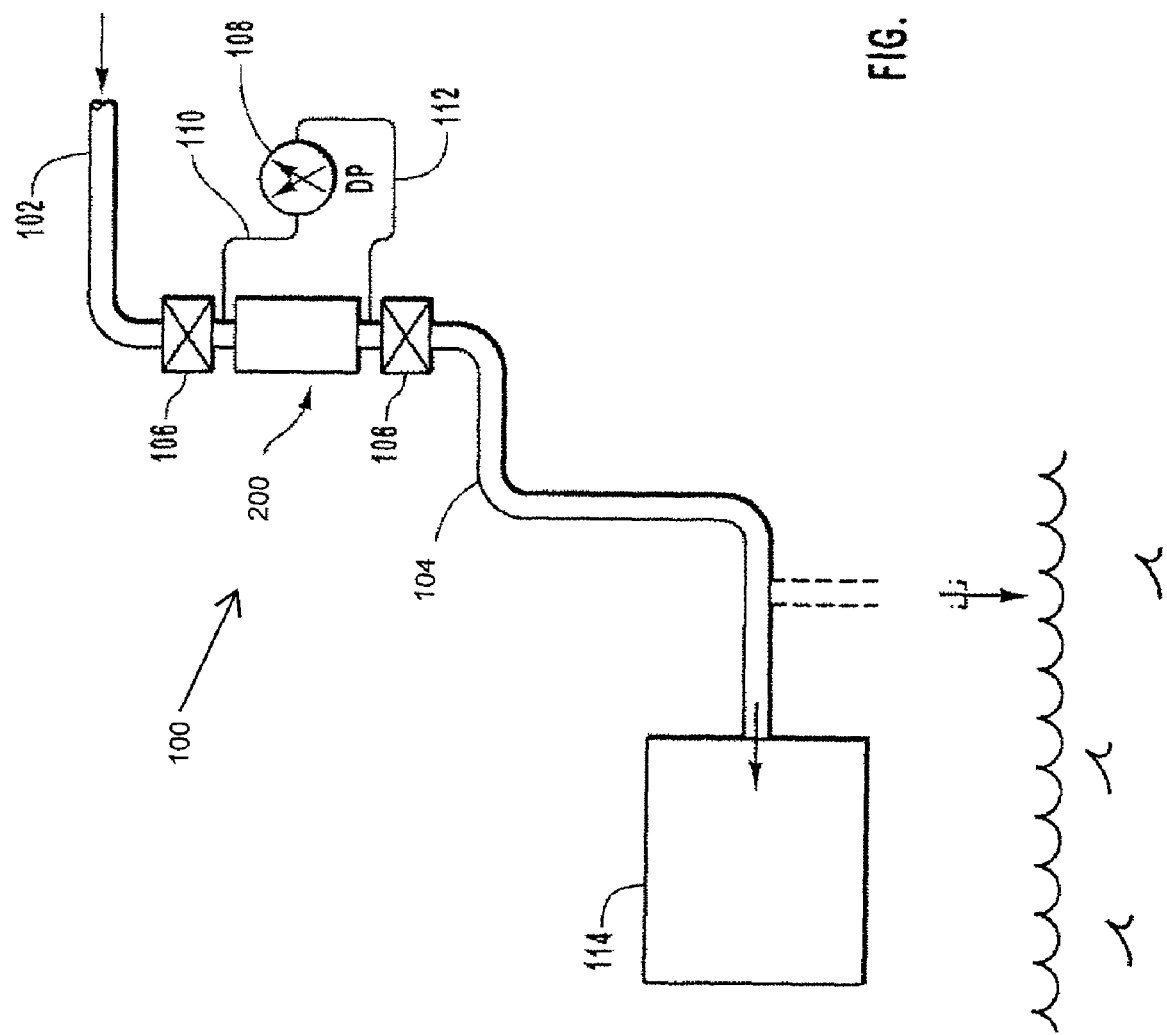
FIG. 1 depicts an embodiment of an ion processing system.

Reference is first made to FIG. 1, wherein an ion processing system is indicated generally at 100, and the direction of the flow of fluid through ion processing system 100 is indicated by arrows. In general, ion processing system 100 includes column assembly 200, column inlet piping 102 and column outlet piping 104. Disposed upstream and downstream of column assembly 200 are isolation valves 106.

Further, a differential pressure gauge 108 is connected across column assembly 200. Differential pressure gauge 108 includes a high pressure connection 110 in fluid communication with column inlet piping 102, and a low pressure connection 112 in fluid communication with column outlet piping 104. Of course, various other types of diagnostic and/or monitoring instrumentation may also be provided in ion processing system 100, including, but not limited to, devices for measuring temperatures, flow rates, and ion concentration, at one or more points throughout ion processing system 100.

Ion processing system 100 also includes a reservoir 114 in fluid communication with column outlet piping 104. Of course, ion processing system 100 may include a variety of other components as well, wherein such other components may include, but are not limited to, prime movers such as pumps.

In one embodiment, ion processing system 100 is used in conjunction with the processing of a fluid stream containing one or more actinides such as uranium (U), plutonium (Pu), and/or americium (Am), or their compounds, lanthanides such as europium (Eu) and cerium (Ce), and/or with fluid streams containing alkali metals such as cesium (Cs), or alkaline earth metals such as strontium (Sr), or their compounds. Other embodiments of ion processing system 100 are well suited to effectuate the removal of organic contaminants, and chlorine (Cl) from fluid streams. Yet other exemplary applications include industrial water treatment, drinking water treatment, alkaline waste treatment, radioactive waste treatment, and treatment of various types of waste produced, for example, as a result of industrial operations and processes.

In general however, ion processing system 100 may be used in any of a variety of applications where it is desired to remove, neutralize, concentrate, or otherwise desirably process, one or more constituents of a fluid stream. Further, ion processing system 100 may be used either alone, or in conjunction with mechanical filtration systems and devices, so as to allow both filtration and ion processing of a fluid stream.

In operation, the fluid stream to be processed is directed into column inlet piping 102 and passes through column assembly 200, preferably oriented vertically, and is then directed to reservoir 114, by way of column outlet piping 104, preparatory to further processing, or disposal. Depending upon such variables as the contents, temperature, and volume of the fluid stream, the fluid stream may alternatively be directed to a waterway or other portion of the environment after treatment, as suggested by the phantom lines in FIG. 1.

Note that, as contemplated herein, "fluid stream" includes streams having both gaseous and liquid components, as well as streams which are substantially liquid in form and streams which substantially comprise one or more gaseous components. Further, while ion processing system 100 and its components are preferably employed in the context of high volume fluid streams such as might be encountered in the utilities industries, other industrial environments, or in environmental applications, embodiments of ion processing system 100 and its components may also be profitably employed in the processing of low volume fluid streams that may be produced or generated as a result of, for example, laboratory processes and operations.

As the fluid stream passes through ion processing system 100, one or more constituents of the fluid stream are substantially removed, or otherwise processed, by column assembly 200. As column assembly 200 removes constituents from the fluid stream, those constituents may clog column assembly 200 over a period of time. Such clogging causes the pressure drop across column assembly 200 to gradually increase over time, thereby compromising the rate at which ion processing system 100 is able to process the fluid stream. Similarly, as ion processing sites in composite medium 300 (see FIG. 2) are utilized, the effectiveness of composite medium 300 will diminish over time. This situation can be remedied by either regenerating the composite medium 300 in column assembly 200, or by replacing composite medium 300 altogether.

With continued reference to FIG. 1, differential pressure gauge 108 indicates the pressure drop across column assembly 200 and thus serves to provide a relative measure of the cleanliness of column assembly 200. In particular, by comparing the pressure drop across column assembly 200, as indicated by differential pressure gauge 108, with the pressure drop across column assembly 200 when it is clean, an evaluation can be made as to the degree of clogging that is present in column assembly 200. Thus, differential pressure gauge 108 serves as a diagnostic tool to indicate when column assembly 200 should be cleaned or replaced. In the event column assembly 200 requires cleaning or replacement, isolation valves 106 can be shut so as to prevent flow through column inlet piping 102 and column outlet piping 104, and thereby facilitate the removal and/or replacement of column assembly 200.

Figure 2:
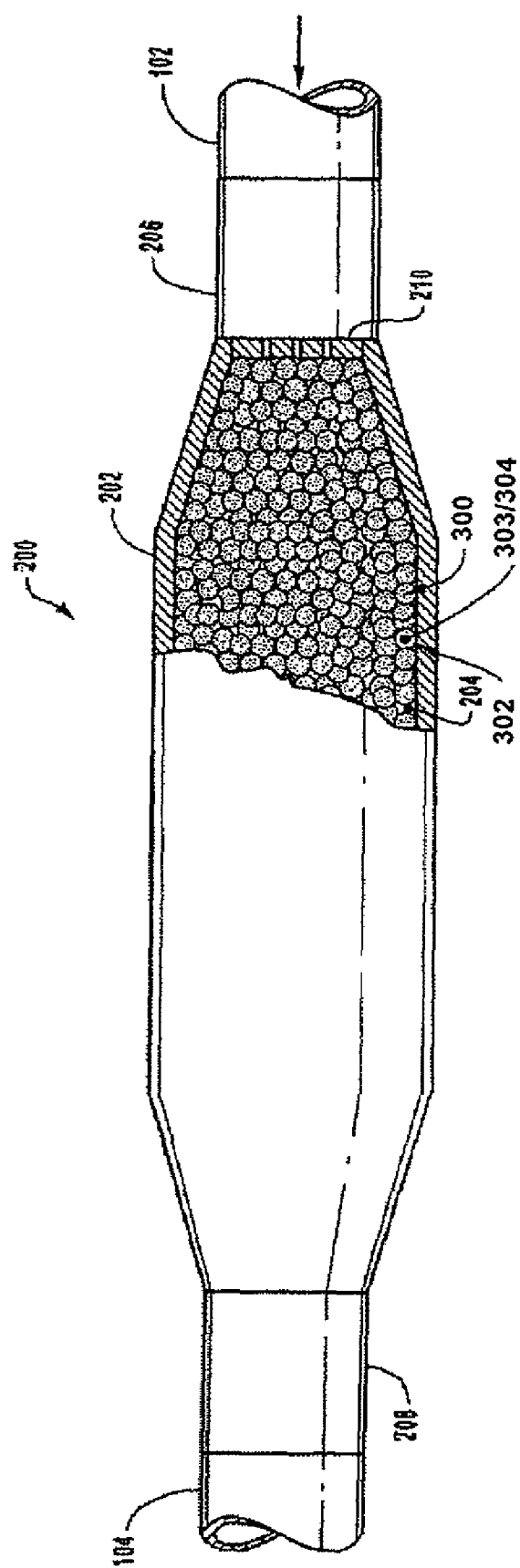
FIG. 2 depicts a partial cutaway view illustrating various features of an embodiment of a column assembly.

Turning now to FIG. 2, various details and features of column assembly 200 are illustrated. In particular, column assembly 200 includes a column housing 202, defining a chamber 204. Column housing 202 further includes a column housing inlet 206 and a column housing outlet 208 that are configured for connection to, and communication with, column inlet piping 102 and column outlet piping 104, respectively. Note that such connection may be accomplished in any of a variety of ways including, but not limited to, welding, brazing, soldering, nuts and bolts, threaded connections, or the like.

Column housing 202 further includes perforated plates 210 or the like, wherein one perforated plate 210 is disposed between chamber 204 and column housing inlet 206, and the other perforated plate 210 is disposed between chamber 204 and column housing outlet 208. Further, an amount of composite medium 300 is disposed in chamber 204. In the exemplary embodiment illustrated in FIG. 2, composite medium 300 is embodied as a plurality of beads 302 each having matrix material 303 combined with one or more active components 304. However, various alternative forms and configurations of composite medium 300 may be employed as necessary to suit the requirements of a particular application.

With continued reference to FIG. 2, the fluid stream that is to be processed enters column housing inlet 206 by way of column inlet piping 102 connected thereto. Openings in perforated plate 210 permit the fluid flow to enter chamber 204 and contact beads 302 of composite medium 300, while at the same time, perforated plate 210 substantially confines beads 302 within column housing 202. As the fluid stream passes into contact with active component 304 dispersed within matrix material 303, active component 304 acts to process one or more constituents of the fluid stream. In one exemplary embodiment, the ion(s) are removed from the fluid stream by active component 304 and transferred to beads 302. After passing through chamber 204, the fluid flow then exits column assembly 200 by way of column housing outlet 208.

Figure 3:
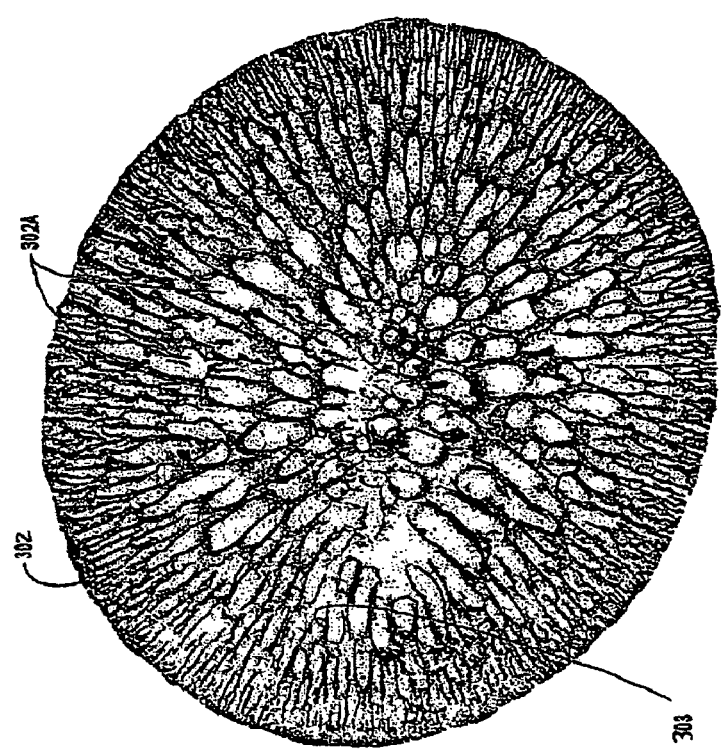
FIG. 3 is a negative image depiction of an embodiment of an active component-impregnated PAN bead.
Figure 4:
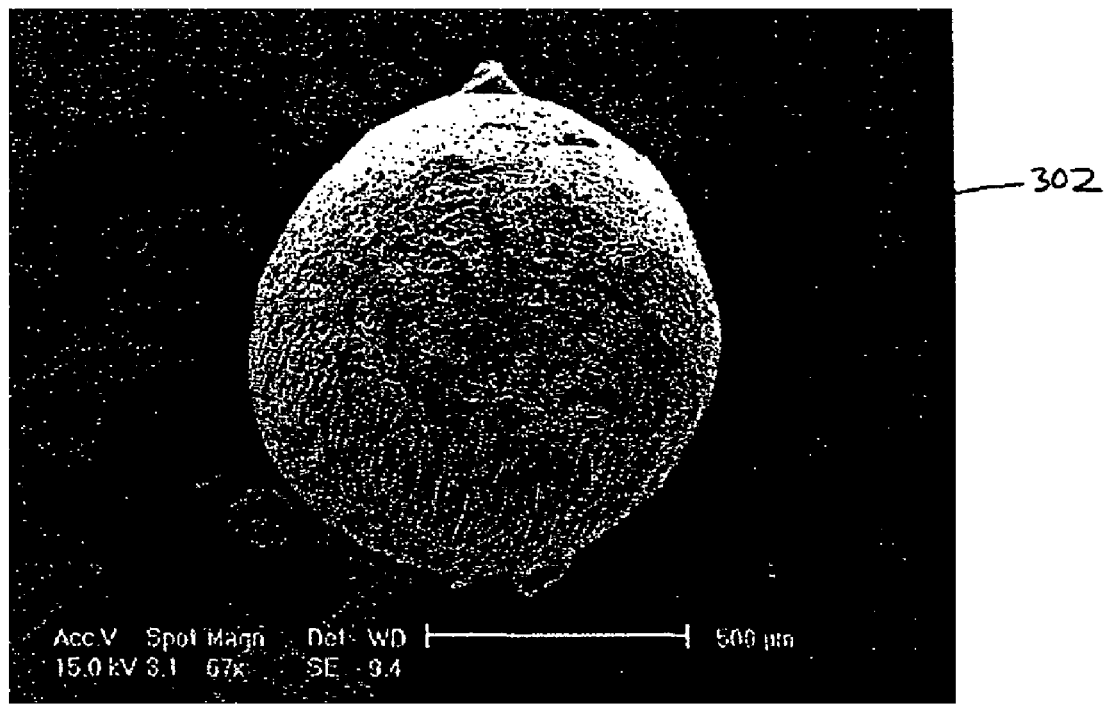
FIG. 4 is a scanning electron micrograph ("SEM") picture of an embodiment of an active component-impregnated PAN bead.
Figure 5:
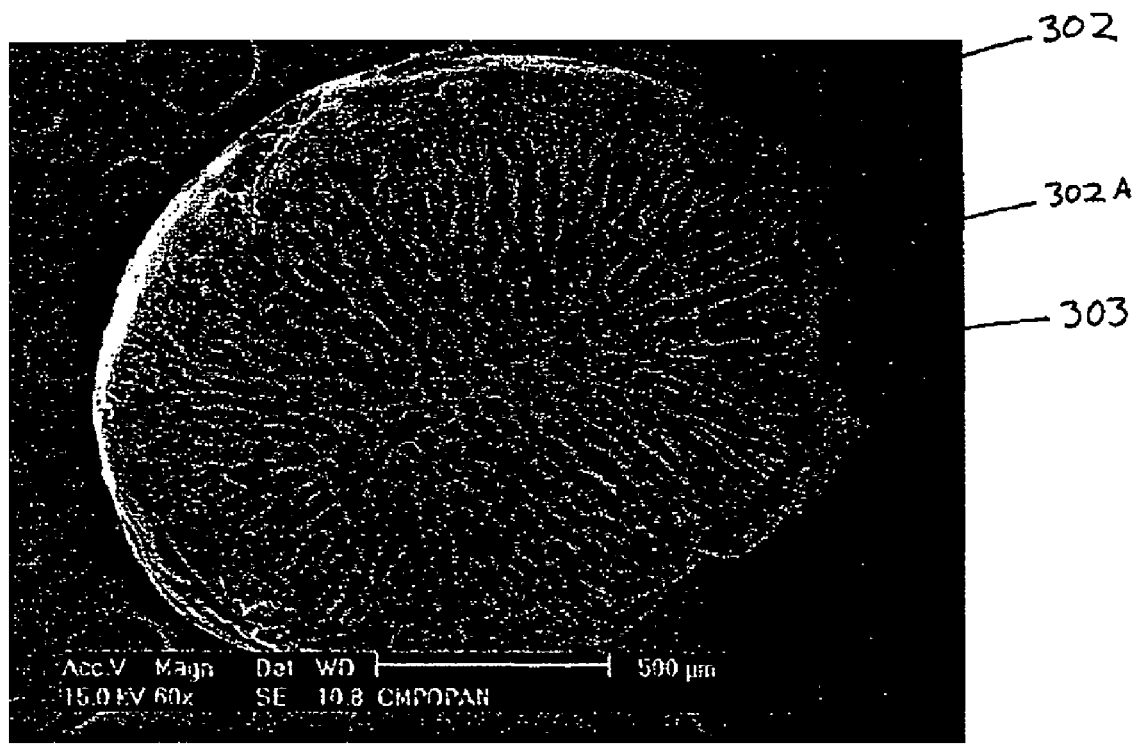
FIG. 5 is a cross-sectional view of the active component-impregnated PAN bead shown in FIG. 4.

With reference now to FIGS. 3-5, additional details are provided regarding one embodiment of a bead 302 geometry in accordance with the teachings of the present invention. In the illustrated embodiment, beads 302 are generally homogeneous and substantially spherical in shape. The embodiment illustrated in FIGS. 3-5 is exemplary only however, and any of a variety of geometries and configurations other than beads may be employed as required to suit a particular application. In general, any configuration that is effective in facilitating implementation of the functionality disclosed herein may be used. FIG. 3 shows a negative image depiction of an active component-impregnated PAN bead 302. FIG. 4 is an SEM picture of a PAN bead 302 impregnated with CMPO, while FIG. 5 is a cross-sectional view of the bead 302 of FIG. 4.

Generally, each bead 302 of composite medium 300 includes a matrix material 303 that defines a plurality of openings, or pores 302A. Due to the large number of pores 302A, matrix material 303 of bead 302 accordingly defines a relatively large pore volume through which one or more active components 304 (not shown) can be distributed. As noted elsewhere herein, it is generally the case that the effectiveness of a composite medium is at least partially a function of the size of the ion processing area with which the fluid desired to be processed comes into contact. Thus, the relatively large surface area collectively defined by pores 302A of beads 302 facilitates a relative improvement in processing capacity over known composite media, pelletized active components, for example, and ion processing systems and devices where it is often the case that only a fraction of the active component may come into contact with the fluid stream, or where the volume of active component that can be usefully employed is otherwise restricted. That is, due to the homogeneity of beads 302 and the large surface area defined by matrix material 303 of beads 302, a relatively greater amount of active component 304 can be exposed to the fluid stream than is typically the case with known ion processing materials.

Because relatively more active component 304 is exposed to the fluid stream than would otherwise be the case, a given amount of active component 304 supported by matrix material 303 of beads 302 removes, or otherwise processes, relatively more material from the fluid stream than would a comparable volume of that active component disposed in a conventional composite medium, system, or device. Thus, composite medium 300 is relatively more efficient in removing, or otherwise processing, materials from a fluid stream than are known composite media, and accordingly has a higher processing capacity than those materials.

In some instances at least, the processing capacity of active component 304 can be quantified as being the maximum value of the ratio of the mass of the ion removed from the fluid stream to the mass of active component 304 present in column assembly 200. In view of the improved processing capacity of composite medium 300, the cost of an ion processing system employing composite medium 300 may be materially lower than the cost of devices employing less efficient ion processing materials.

Not only does the geometry of beads 302 serve to facilitate an increase in the processing capacity of active component 304 to a level higher than would otherwise be possible, but that geometry has other useful implications as well. One such implication relates to the amount of active component 304 that beads 302 can effectively hold. In particular, the large pore volume defined by beads 302 permits the weight of active component 304 as a percentage of the total weight of composite medium 300 to be varied over a wide range, from about 5% to about 95% by weight. In contrast, the weight percentage of active component in some known composite media is typically limited to a much narrower range.

Thus, beads 302 of composite medium 300 are well suited to facilitate wide variations in the concentrations, or loading, of active component 304, and the relative weight percent loading of active component 304 in beads 302 may desirably be varied as required to suit particular applications and/or to achieve one or more desired results. Further, multiple active components 304 may be used in conjunction with beads 302 so as to produce a composite medium 300 that can be employed to effect simultaneous and substantial removal, or other processing, of more than one constituent of a fluid stream. As noted elsewhere herein, such active components may employ any of a variety of mechanisms to effectuate such removal and/or processing.

The geometry of beads 302 also lends desirable kinetic characteristics to composite medium 300. In particular, the homogeneity of the size and shape of beads 302 facilitates improved flow through composite medium 300. Thus, composite medium 300 is particularly well-suited for use in high flow rate applications such as are often encountered in industrial environments.

As the foregoing discussion suggests, beads 302 of composite medium 300 possess a variety of properties that make them desirable for use in any number of applications, and that suit them particularly well for use in those situations wherein it is desired to effectively and efficiently treat high volume and/or high flow rate fluid streams. By way of example, the relatively large pore volume defined by matrix material 303 of beads 302 facilitates high loading capacities and effective and efficient use of active component 304. As another example, the porosity of beads 302 permits ions to be readily transported into each bead 302 of composite medium 300 and thus facilitates the effective and efficient processing of high flow rate fluid streams.

Attention is directed now to a discussion of various exemplary active components 304. Generally, "active component" refers to those materials, however embodied, that use a variety of mechanisms to process the fluid stream, wherein such mechanisms include, but are not limited to, ion exchange, adsorption, absorption, extraction, complexation, or various combinations thereof. By employing one or more of such mechanisms, various embodiments of active components 304 are able to, among other things, remove, extract, separate, concentrate, or otherwise desirably process, one or more constituents of a fluid stream. Sorbents and similar materials comprise but one example of an active component.

In one embodiment, active component 304 comprises an inorganic compound such as crystalline silicotitanate (CST), or the like. However, any of a wide variety of other active components, both organic and inorganic, may be used, either individually or in various combinations, as required to suit a particular application and/or to achieve one or more desired effects. Exemplary active components include various types of carbon, ammonium molybdophosphate (AMP), octyl (phenyl) N,N-diisobutylcarbamoylmethylphosphine oxide (CMPO) and other carbamoyl phosphine oxides, 4,4'(5')di-(t-butylcyclohexano)-18-crown-6, bis (2,4,4-trimethylpentyl) dithiophosphinic acid, various amines, alkylphosphoric acids such as bis(2-ethylhexyl)phosphoric acid (HDEHP), neutral organophosphorus compounds such as tributyl phosphate (TBP), organic compounds such as crown ethers and polyethylene glycol (PEG) and their mixtures, and all organic extractants that are stable in the solution of the binding polymer, PAN for example, and are able to form an organic phase inside the matrix.

Organic active components, including various types of carbon such as activated carbon, are particularly well-suited for the treatment of water, and are effective in removing, among other things, chlorine, organic pesticides, and heavy metals such as mercury. Other exemplary applications of active components 304 include odor control, air cleaning and/or purification, as well as removal of undesirable color(s) from a fluid stream, as is required in some pharmaceutical applications. Note that "carbon" refers to activated carbon as well as to various other types and forms of carbon or materials substantially comprising carbon.

Another embodiment of a composite medium 300 employs CMPO as active component 304. CMPO is particularly useful in metal ion sorption applications including, but not limited to, treatment of radioactive waste solutions or analysis of samples, wherein those radioactive waste solutions and samples contain actinides such as americium, plutonium and uranium, or their compounds, and/or lanthanides and their compounds.

Figure 6:
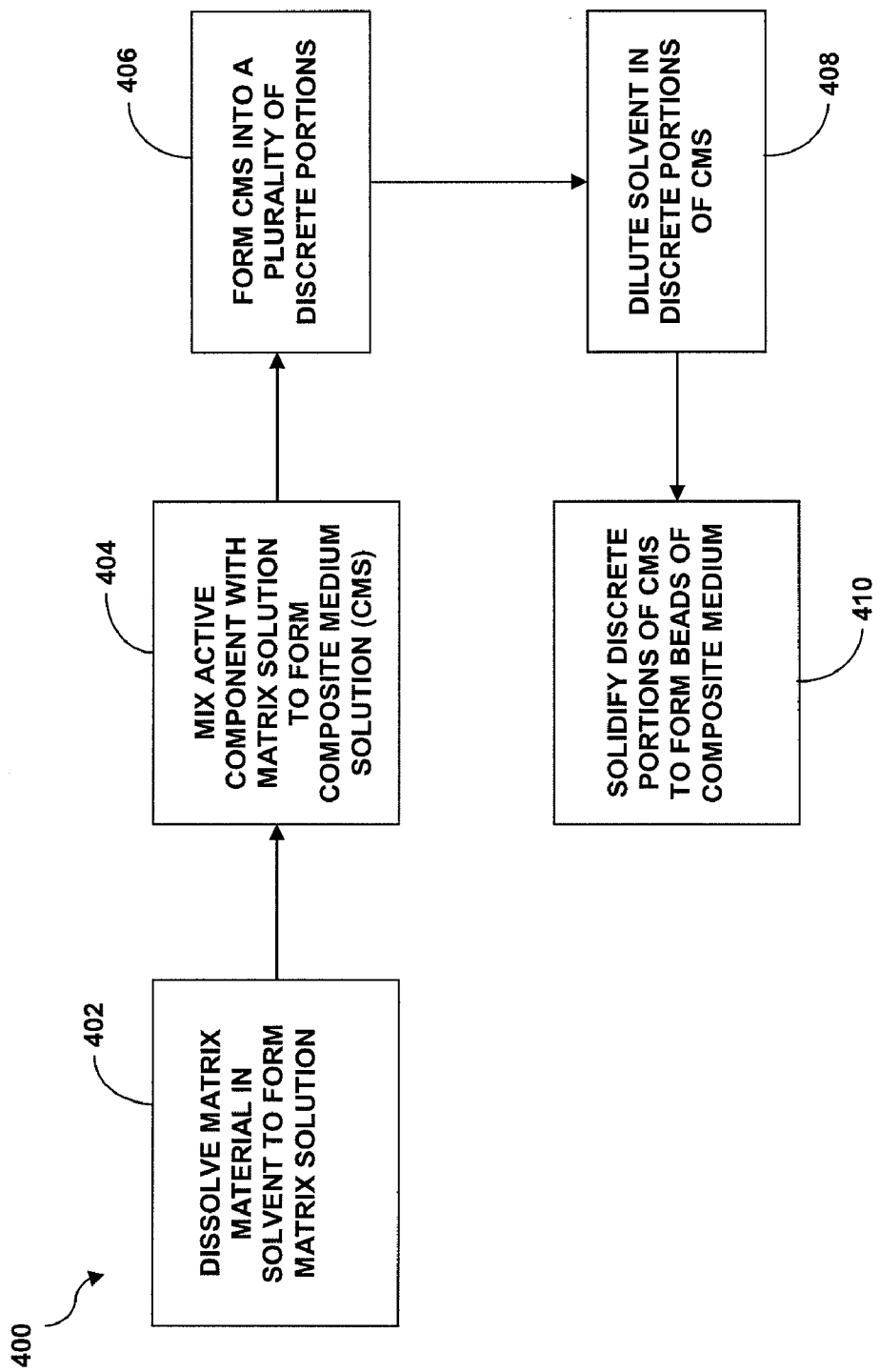
FIG. 6 indicates various steps of one embodiment of a process for making an active component-impregnated PAN bead.

Directing attention now to FIG. 6, one embodiment of a process 400 for producing composite medium 300 is indicated. In step 402, a matrix material, preferably PAN in a solid form, is dissolved in a solvent to form a matrix solution whose concentration of PAN with respect to the solvent may be varied as required to facilitate achievement of a particular desired result.

As used herein, "PAN" includes, among other things, an acrylonitrile polymer or copolymer containing at least forty percent (40%) acrylonitrile units. Typically, the acrylonitrile homopolymer includes crystalline, quasicrystalline, and amorphous phases. Note however, that various other polymeric matrix materials, both organic and inorganic, may profitably be substituted for PAN in order to suit the requirements of a particular application.

In one embodiment, the solvent comprises nitric acid. Other suitable solvents include, but are not limited to, aprotic polar organic solvents such as dimethylformamide, dimethylacetamide, dimethylsulfoxide (DMSO), sulfolane, ethylene carbonate, and N-methylpyrrolidone, acids such as concentrated sulfuric acid, and concentrated aqueous solutions of certain organic salts such as lithium bromide, sodium thiocyanate, and zinc chloride. In general however, any solvent providing the functionality disclosed herein is contemplated as being within the scope of the present invention.

In one embodiment, step 402 is performed at room temperature (defined herein to be a range from about 50 degrees Fahrenheit to about 80 degrees Fahrenheit) and standard pressure (1.0 atmospheres, or 14.65 pounds per square inch), though other temperatures and/or pressures may be desirable for certain applications or to achieve particular results.

Upon dissolution of the PAN in the solvent, process 400 then proceeds to step 404 wherein a pre-determined amount of one or more active components 304 is combined with the matrix solution to form the CMS. Alternatively, the CMS may be formed in situ by precipitation or other processes. In the case where only organic active component(s) 304 are employed, the CMS comprises an emulsion while, on the other hand, where only inorganic active component(s) 304 are employed, the CMS comprises a suspension. As used herein however, "CMS" refers to any combination of solvent, matrix material, and active components, whether such combination takes the form of a suspension, emulsion, solution, or other form. In at least some embodiments of the invention, active component 304 comprises CST. As noted elsewhere herein however, a variety of active components 304, both organic and inorganic, may be employed singly, or in various combinations so as to result in the formation of a CMS, and ultimately a composite medium 300, having particular desired properties.

It will further be appreciated that the amount of active component(s) 304 mixed with the matrix solution may be varied as required to achieve formation of beads 302 having particular desired properties and capabilities. After the CMS has been formed, process 400 proceeds to step 406, wherein the CMS is formed into a plurality of discrete portions. Preferably, each discrete portion comprises a drop. However, such discrete portions may alternatively comprise any other geometry and/or volume necessary to suit the requirements of a particular application. In step 408, the solvent in the drops thus formed is diluted, removed, or otherwise neutralized, so that each drop substantially comprises PAN and one or more active components 304. The solvent is preferably diluted by depositing the drops into a water bath, or the like. It will be appreciated that variables such as the temperature of the water bath may be varied as required to achieve a particular result or effect. Likewise, other aqueous solutions may be substituted for water so as to facilitate achievement of a desired result.

Upon dilution, removal, or neutralization, of the solvent, the PAN then solidifies to form a bead comprising a matrix material 303 which has entrapped active component(s) 304 in a porous support. Note that, as contemplated herein, "bead" generally refers to a discrete portion of composite medium 300 that has been substantially cleansed of solvent and comprises a matrix material 303 wherein the matrix material 303 supports, i.e., contain, entraps, is bonded to, or otherwise includes or is attached to in any way, one or more active components 304.

In one alternative embodiment, the solvent is reconstituted from the water bath by heating the water bath until the water evaporates and only solvent remains. In this way, the solvent can be reused for multiple processes. A variety of other techniques may alternatively be employed to facilitate reconstitution of the solvent.

In step 410, the drops are then dried, preferably in air, to form beads 302 of composite medium 300. The air drying process lends mechanical strength and durability to beads 302. Such strength and durability makes beads 302 well-suited to withstand rough handling and other adverse environmental conditions. Once formed, beads 302 can be sieved, or otherwise sorted, to provide a desired size fraction necessary for a particular application. As an alternative to drying, beads 302 may be allowed to remain wet after the solvent has been diluted or removed, and used in that state.

Figure 7:
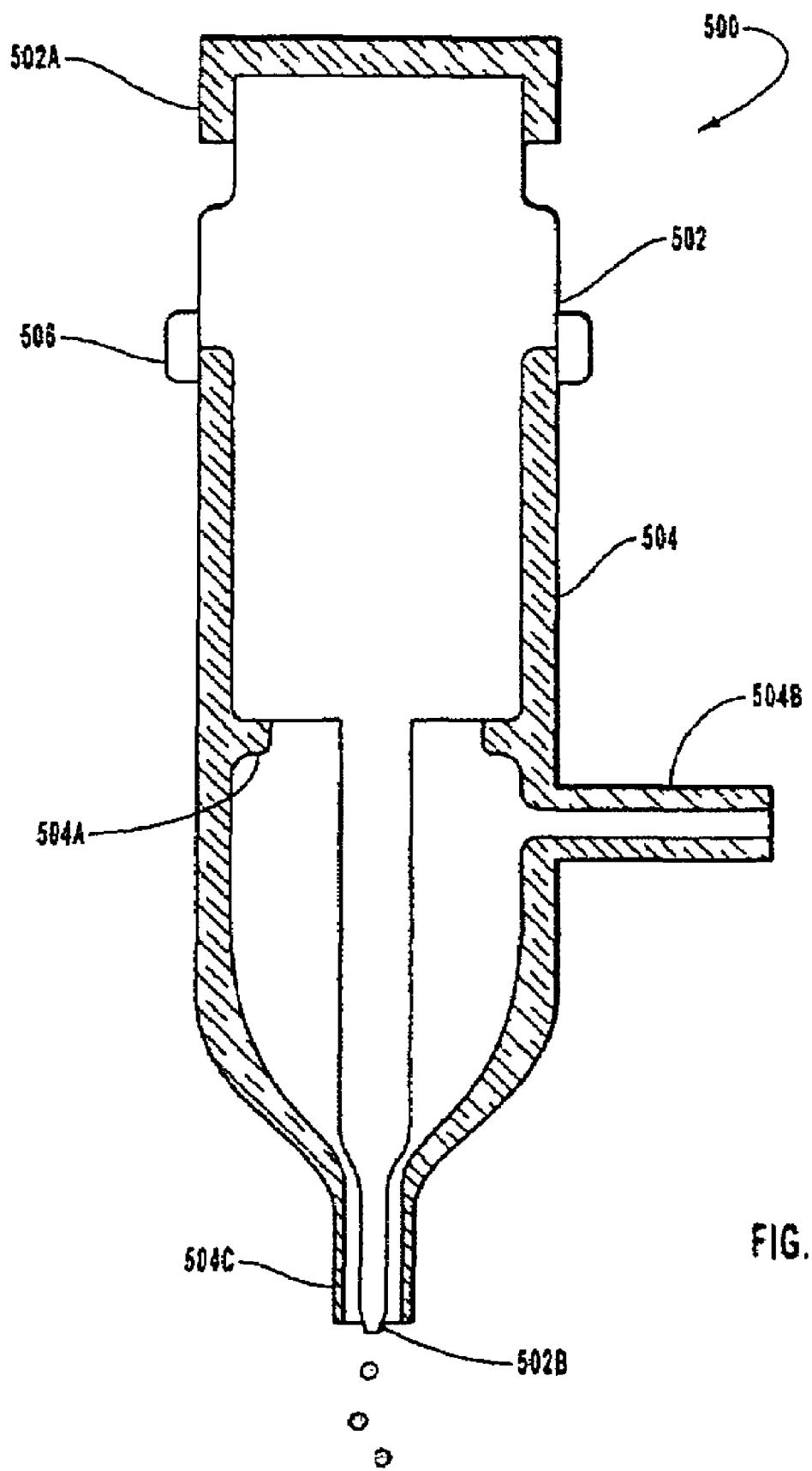
FIG. 7 illustrates various features of an embodiment of a bead generation apparatus used to produce beads of the composite medium.

Turning now to FIG. 7, one embodiment of a bead generation apparatus adapted to perform step 406 of process 400 is indicated generally as 500. Bead generation apparatus 500 includes a reservoir 502 having a cap 502A and terminating in a dispensing tip 502B. In those instances where it is desired to stir or otherwise agitate CMS contained in fluid reservoir 502, cap 502A need not be employed. As indicated in FIG. 7, reservoir 502 is substantially disposed within an air chamber 504 and rests on an annular lip 504A defined by air chamber 504. A coupling 506 ensures that reservoir 502 remains in place. It will be appreciated that a variety of other structures and/or devices may be employed to provide the functionality of coupling 506, as disclosed herein, wherein such structures and devices include, but are not limited to, threaded connections and the like. Such other structures and devices are accordingly contemplated as being within the scope of the present invention. With continued reference to FIG. 7, air chamber 504 further includes an air inlet connection 504B and an air outlet 504C. Air chamber 504 and reservoir 502 are preferably constructed substantially of materials such as glass, plastic, fiberglass, or the like.

In operation, a pre-determined amount of CMS is disposed in fluid reservoir 502. Gravitational force and/or other pressurization of fluid reservoir 502 causes CMS to pass downward through dispensing tip 502B. It will be appreciated that dispensing tip 502B may comprise any of a variety of fluid conduits configured to facilitate dispensation of CMS. Note that, in one embodiment, bead generation apparatus 500 further includes a valve or the like to control the flow of CMS through dispensing tip 502B. Substantially simultaneous with the flow of CMS through dispensing tip 502B, a flow of air, or other suitable gas, is directed into air chamber 504 by way of air inlet connection 504B.

As drops of CMS form at dispensing tip 502B, the flow of air through air outlet 504C facilitates detachment of those drops from dispensing tip 502B. The air flow through air outlet 504C thus cooperates with dispensing tip 502B of fluid reservoir 502 to produce a plurality of CMS drops which, as discussed above, are ultimately transformed into beads 302 of composite medium 300. It will be appreciated that variables including, but not limited to, the pressure of CMS in reservoir 502, rate of air flow through chamber 504, the diameter of dispensing tip 502B, the diameter of air outlet 504C, and the position of dispensing tip 502B relative to air outlet 504C, may individually and/or collectively be varied as required to achieve a particular size of CMS drop and/or CMS drop production rate.

The following example serves to explain an embodiment of the beads 302 of the composite medium 300 in more detail. For comparative purposes, a substrate impregnated with PAN and CMPO, as described in U.S. Pat. No. 6,514,566 to Mann et al., is also described. The example is not to be construed as being exhaustive or exclusive as to the scope of the invention.

EXAMPLES

Example 1

Formation of PAN/CMPO Beads

Beads 302 of the composite medium 300 were formed by dissolving fibrous PAN in nitric acid at room temperature. The PAN/nitric acid mixture included from approximately 3% by weight ("wt %") to approximately 5 wt % fibrous PAN and from approximately 55 wt % to approximately 60 wt % nitric acid. The PAN/nitric acid mixture was stirred for approximately 1 hour. A neat organic extractant, such as CMPO, was added to the PAN/nitric acid mixture and mixed to form a solution that appeared homogenous. From approximately 20 wt % to approximately 33 wt % of CMPO was added to the PAN/nitric acid mixture. The solution was then placed in an apparatus for dispersing the material into droplets, which is referred to as the bead generation apparatus 500 and is shown in FIG. 7.

The solution was gravity fed from the reservoir 502 to the dispensing tip 502B, where droplets are formed. The formation and release of droplets from the dispensing tip 502B is accelerated by the flow of air downward around the dispensing tip 502B. The droplets of the solution were dropped into a constantly mixed bath of deionized water, which diluted the nitric acid sufficiently to allow the PAN, with the CMPO, to solidify into a highly porous sphere or bead 302, as shown in FIGS. 3-5. The droplets were left in the deionized water bath for from approximately 10 minutes to approximately 15 minutes to completely wash the nitric acid from the beads 302. The beads 302 were then removed and air dried.

After drying, the beads 302 were sieved to the desired size fraction. Typically, beads 302 in a size that ranges from approximately 0.1 mm to approximately 0.75 mm are most effective for use in a column. However, smaller or larger sizes may also be utilized.

Comparative Example 2

Formation of PAN/CMPO Impregnated Substrate (Glass Filter Medium)

Figure 8:
FIG. 8 is a SEM picture of a glass filter substrate and FIG. 9 is a SEM picture of the glass filter substrate impregnated with PAN and CMPO as described in U.S. Pat. No. 6,514,566 to Mann et al.
Figure 9:
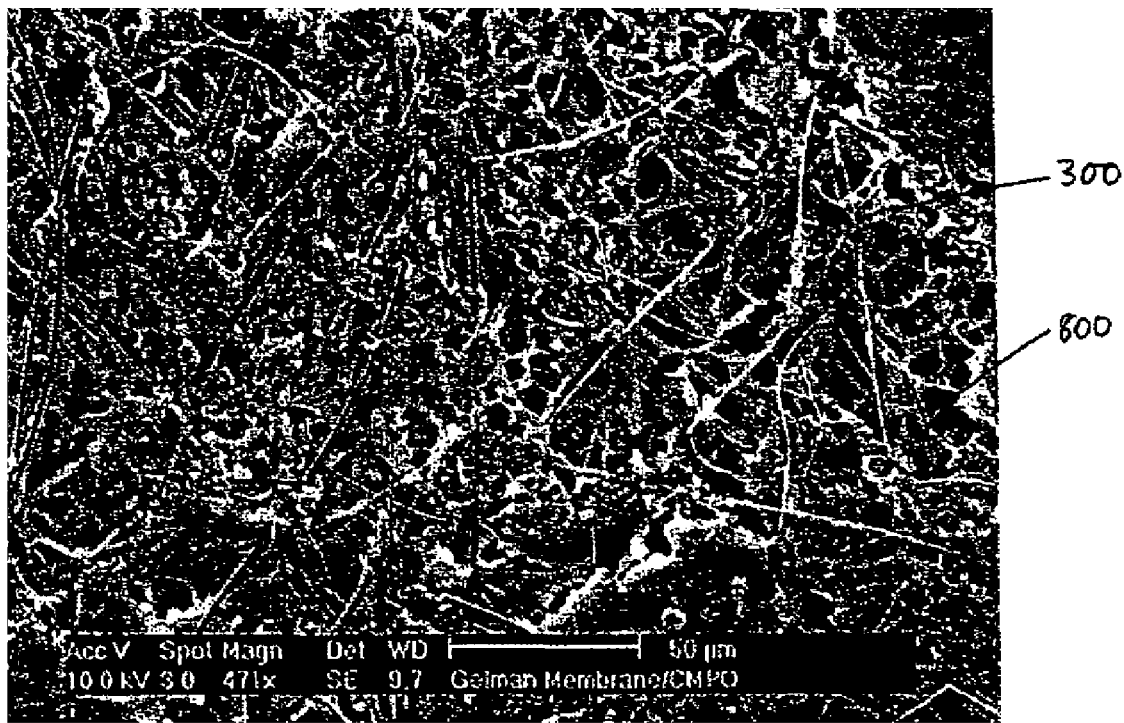

A substrate impregnated with PAN and CMPO was formed as described in U.S. Pat. No. 6,514,566 to Mann et al. The impregnated substrate was formed by dissolving fibrous PAN in nitric acid at room temperature. From approximately 3 wt % to approximately 5 wt % of the PAN was dissolved in from approximately 55 wt % to 60 wt % nitric acid. The PAN/nitric acid mixture was stirred for approximately 0.5 hours. A neat organic extractant (approximately 20 wt % to approximately 33 wt % of the extractant), such as CMPO, was added to the PAN/nitric acid mixture and mixed until the solution appeared homogenous. The solution of nitric acid, PAN, and CMPO was then evenly dispensed onto a glass filter (Gelman Type A/E glass filter, 1.0 µm particle size retention) supported by a filter assembly. The glass filter 800 before impregnation with the solution of nitric acid, PAN, and CMPO is shown in FIG. 8. A vacuum was then applied to the volume below the glass filter 800 to draw the solution into the interstices (fibers) of the glass filter 800. The glass filter 800 was thoroughly impregnated (coated) with the nitric acid, PAN, and CMPO solution using this method. The impregnated filter was then removed from the filter apparatus and placed into a deionized water bath. The deionized water diluted the nitric acid sufficiently to allow the PAN and the CMPO to solidify within interstices of the glass filter 800. The glass filter 800, which was impregnated with composite medium 300, was then left in the deionized water bath for from approximately 10 minutes to approximately 15 minutes to completely wash the nitric acid from the solidified PAN. The impregnated filter was then removed from the deionized water bath and air dried. The impregnated filter is as shown in FIG. 9.

As evidenced by a comparison between FIGS. 3-5 and FIGS. 8 and 9, beads 302 of the composite medium 300 are formed by the method described in Example 1. In contrast, the composite medium 300 is impregnated in a substrate by the method described in Comparative Example 2.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. A composite medium suitable for use in processing a fluid stream, the composite medium comprising:
   a porous matrix comprising polyacrylonitrile; and
   at least one active component dispersed throughout the polyacrylonitrile of the porous matrix, the at least one active component comprising a carbamoyl phosphine oxide.

2. The composite medium of claim 1, wherein the at least one active component comprises octyl (phenyl) N,N-diisobutylcarbamoylmethylphosphine oxide.

3. The composite medium of claim 1, wherein the composite medium comprises a plurality of beads.

4. The composite medium of claim 3, wherein each of the plurality of beads is substantially spherical.

5. A composite medium, comprising:
   a porous matrix comprising a mixture of polyacrylonitrile and at least one active component, the at least one active component dispersed throughout the polyacrylonitrile comprising octyl (phenyl) N,N-diisobutylcarbamoylmethylphosphine oxide.

6. The composite medium of claim 5, further comprising another active component selected from the group consisting of carbon, ammonium molybdophosphate, 4,4'(5')di-(t-butylcyclohexano)-18-crown-6, bis(2,4,4-trimethylpentyl) dithiophosphinic acid, tributyl phosphate, amines, alkylphosphoric acids, polyethylene glycol, and combinations thereof.

7. The composite medium of claim 5, wherein the composite medium comprises a plurality of beads.

8. The composite medium of claim 5, wherein each of the plurality of beads is substantially spherical.

9. The composite medium of claim 6, wherein the another active component is selected from the group consisting of ammonium molybdophosphate, 4,4'(5')di-(t-butylcyclohexano)-18-crown-6, bis(2,4,4-trimethylpentyl) dithiophosphinic acid, and polyethylene glycol.

10. A composite medium, comprising:
    a porous matrix comprising polyacrylonitrile;
    octyl (phenyl) N,N-diisobutylcarbamoylmethylphosphine oxide distributed throughout the polyacrylonitrile of the porous matrix; and
    another active component supported by the porous matrix and selected from the group consisting of ammonium molybdophosphate (AMP), 4,4'(5')di-(t-butylcyclohexano)-18-crown-6, bis(2,4,4-trimethylpentyl) dithiophosphinic acid, tributyl phosphate (TBP), polyethylene glycol (PEG), and combinations thereof.

11. The composite medium of claim 10, wherein the another active component comprises tributyl phosphate.

* * * * *

UNITED STATES PATENT AND TRADEMARK OFFICE
CERTIFICATE OF CORRECTION

PATENT NO. : 7,629,292 B2  Page 1 of 1
APPLICATION NO. : 11/154976
DATED : December 8, 2009
INVENTOR(S) : Mann et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 917 days.

Signed and Sealed this

Twenty-first Day of December, 2010

David J. Kappos
*Director of the United States Patent and Trademark Office*